(12) United States Patent
Kim

(10) Patent No.: US 8,390,293 B2
(45) Date of Patent: Mar. 5, 2013

(54) SUPERCONDUCTOR WITH ENHANCED HIGH MAGNETIC FIELD PROPERTIES, MANUFACTURING METHOD THEREOF, AND MRI APPARATUS COMPRISING THE SAME

(76) Inventor: Yong Jihn Kim, Mayaguez, PR (US)

( * ) Notice: Subject to any disclaimer, the term of this patent is extended or adjusted under 35 U.S.C. 154(b) by 407 days.

(21) Appl. No.: 12/843,039

(22) Filed: Jul. 25, 2010

(65) Prior Publication Data

US 2010/0285966 A1    Nov. 11, 2010

Related U.S. Application Data

(63) Continuation of application No. 12/183,333, filed on Jul. 31, 2008, now Pat. No. 7,791,343.

(60) Provisional application No. 60/963,145, filed on Aug. 1, 2007, provisional application No. 60/964,441, filed on Aug. 10, 2007.

(51) Int. Cl.
*G01V 3/00*    (2006.01)

(52) U.S. Cl. .................................. 324/322; 324/319
(58) Field of Classification Search .......... 324/300–322; 600/407–445; 505/100, 300; 420/590
See application file for complete search history.

(56) References Cited

U.S. PATENT DOCUMENTS

| 5,004,539 | A * | 4/1991 | Colwell, Jr. | 210/222 |
| 7,218,115 | B2 * | 5/2007 | Morita et al. | 324/322 |
| 7,632,784 | B2 * | 12/2009 | Rokhvarger et al. | 505/500 |
| 7,791,343 | B2 * | 9/2010 | Kim | 324/322 |
| 2011/0111962 | A1 * | 5/2011 | Wang et al. | 505/112 |

* cited by examiner

*Primary Examiner* — Brij Shrivastav
(74) *Attorney, Agent, or Firm* — Renaissance IP Law Group LLP

(57) ABSTRACT

A superconductor exemplarily described herein includes a superconducting material containing vortex pinning centers and non-magnetic disorders formed in the superconducting material. The superconductor described herein is suitable for use in magnet applications and power transmission.

15 Claims, 6 Drawing Sheets

SUPERCONDUCTOR WITH ENHANCED HIGH MAGNETIC FIELD PROPERTIES, MANUFACTURING METHOD THEREOF, AND MRI APPARATUS COMPRISING THE SAME

CROSS-REFERENCE TO RELATED APPLICATIONS

This application is a Continuation Application of U.S. application Ser. No. 12/183,333, filed on Jul. 31, 2008, which claims priority from U.S. Provisional patent application Ser. No. 60/963,145 entitled "METHOD OF ENHANCING HIGH MAGNETIC FIELD PROPERTIES OF SUPERCONDUCTING MATERIALS, WIRES, AND TAPES, INCLUDING Nb—Ti, $Nb_3Sn$, AND $MgB_2$" and filed on Aug. 1, 2007, and U.S. Provisional patent application Ser. No. 60/964,441 entitled "$MgB_2$ MAGNET-BASED MRI AND RELATED APPARATUS" and filed on Aug. 10, 2007, the entire disclosures of which are incorporated herein by reference.

BACKGROUND

1. Field of Invention

Embodiments of the present invention relate generally to superconductors and methods for manufacturing the same. More specifically, embodiments of the present invention relate to a superconductor with high magnetic field properties, and to a method for enhancing high magnetic field properties of a superconductor.

2. Description of the Related Art

Currently Nb—Ti alloy and $Nb_3Sn$ are mostly used to produce high field magnets. Recently discovered 39K superconductor $MgB_2$ has great potential for magnets, which has been intensively investigated (see C. Buzea and T. Yamashita, "Review of the Superconducting Properties of $MgB_2$", Supercond. Sci. Technol. 15, R115-R146 (2001)). For power transmission superconducting cables, made of the high $T_c$ cuprates, are under development (see W. Buckel and R. Kleiner, "Superconductivity", Wiley-VCH, Weinheim (2004), p. 382).

For magnet applications and power transmission, superconducting materials should have high critical current densities at high magnetic fields, due to strong vortex pinning or flux pinning. Nb—Ti alloy and $Nb_3Sn$ show good pinning properties. Nevertheless, for special scientific applications, such as accelerator applications, the high field properties of these materials may need to be enhanced more. Furthermore, $MgB_2$, which can be used near 20K, does not exhibit good pinning properties.

Pinning properties of superconducting materials can be enhanced by adding impurities, columnar defects, artificial pins, and nano-particles, mechanical alloying, introducing grain boundaries and precipitates, and applying radiation damage (see W. Buckel and R. Kleiner, "Superconductivity", Wiley-VCH, Weinheim (2004), p. 282). Changing the preparation conditions of samples also induces the disorder, leading to the enhancement of high field properties. These methods basically introduce the flux pinning centers into superconductors without reducing the critical temperature $T_c$ significantly. Most progress has been made empirically, by trial and error, because there is no reliable microscopic theory on the vortex pinning due to disorder, in general (see W. Buckel and R. Kleiner, "Superconductivity", Wiley-VCH, Weinheim (2004), p. 284).

From a physical point of view, the above pinning centers essentially produce the electric potential fluctuations, leading to the electron density fluctuations. Since the electron-phonon interaction, the deriving force of superconductivity, favors the electron density correlations (see Mi-Ae Park and Yong-Jihn Kim, "Weak localization effect in superconductors from radiation damage", Phys. Rev. B 61, 14733 (2000)), these pinning sites may favor the flux penetration, destroying superconductivity locally but allowing superconductivity overall, at high magnetic fields in type II superconductors. In short, these known techniques employ electric potential fluctuations, i.e., electric properties, to produce the pinning centers in superconductors. However, superconductivity near these pinning centers is destroyed due to the global energy minimization in the presence of flux penetration, rather than due to the local electric potential fluctuations. In other words, these potential fluctuations are not strong enough to destroy the superconductivity locally and therefore may not be the most desirable pinning centers.

In Magnetic Resonance Imaging (MRI) and Nuclear Magnetic Resonance (NMR) apparatus, the superconducting magnet forms a crucial part, because it dictates the operating temperature and the available magnetic field strength. Currently, Nb—Ti and $Nb_3Sn$ magnets are mostly used. However, the low transition temperature $T_c$ of these materials requires liquid helium, which leads to the high cost of the MRI and NMR apparatus and maintenance. Therefore, it is highly desirable to find a higher $T_c$ material for magnets of MRI and related NMR apparatus, which does not require expensive liquid helium.

In 2001, Akimitsu et al. found that $MgB_2$ is a superconductor with $T_c$=39K (see J. Nagamatsu et al., Nature, volume 410 (2001), p. 63-64). Due to high $T_c$, low cost, and good mechanical properties, $MgB_2$ has great potential for magnet applications. Indeed, in November 2006, the first $MgB_2$ magnet-based MRI was introduced by ASG Superconductors, Paramed Medical Systems, and Columbus Superconductors. The operating temperature of 20K was achieved using two cryocoolers, without using any cryogenic liquid. However, the $MgB_2$ magnet produced only 0.5 T, limiting the marketability of the $MgB_2$ magnet-based MRI, because the current Nb—Ti and $Nb_3Sn$ magnet-based MRI can produce 3 T at 4K using the liquid helium. High magnetic fields provide better images because the resolution of the image depends on the square of the strength of the magnetic field (see E. M. Haake, R. W. Brown, M. R. Thomson, and R. Venkatesan, "Magnetic Resonance Imaging: Physical Principles and Sequence Design", (Wiley-Liss, New York, 1999), p. 6).

For magnet applications, superconducting materials should have high critical current densities at high magnetic fields, due to strong vortex or flux pinning. However, $MgB_2$ does not show good pinning properties. Therefore, additives can be introduced into $MgB_2$ to enhance the vortex or flux pinning. For example, typical additives include: C (see S. X. Dou et al., Appl. Phys. Lett. 83, (2003) p. 4996), Al (see A. Berenov et al., Cond-mat/0405567 (2004)), SiC (S. X. Dou et al., Appl. Phys. Lett. 81, (2002) p. 3419), Ti, Zr (see Y. Zhao et al., Appl. Phys. Lett. 79 (2001) p. 1154), Si (see X. L. Wang et al., Physica C 385 (2003) p. 461), $Y_2O_3$ (see J. Wang et al., Appl. Phys. Lett. 81 (2002) p. 2026), and Mg(B,O) precipitates (see Eom et al., Nature 411 (2001) p. 558). Although considerable progress has been made, more progress is required for $MgB_2$ to be used for high field magnets.

SUMMARY

One embodiment exemplarily described herein can be generally characterized as a superconductor. The superconductor may comprise superconducting material containing vortex pinning centers and non-magnetic disorders formed in the superconducting material.

Another embodiment exemplarily described herein can be generally characterized as a method for manufacturing a superconductor. The method may include preparing a superconducting material, forming vortex pinning centers in the superconducting material and forming non-magnetic disorders in the superconducting material.

Yet another embodiment exemplarily described herein can be generally characterized as an MRI or an NMR apparatus comprising the superconductor described herein.

These and other aspects of the invention will become evident by reference to the following description of the invention, often referring to the accompanying drawings.

DETAILED DESCRIPTION

Figure 1:
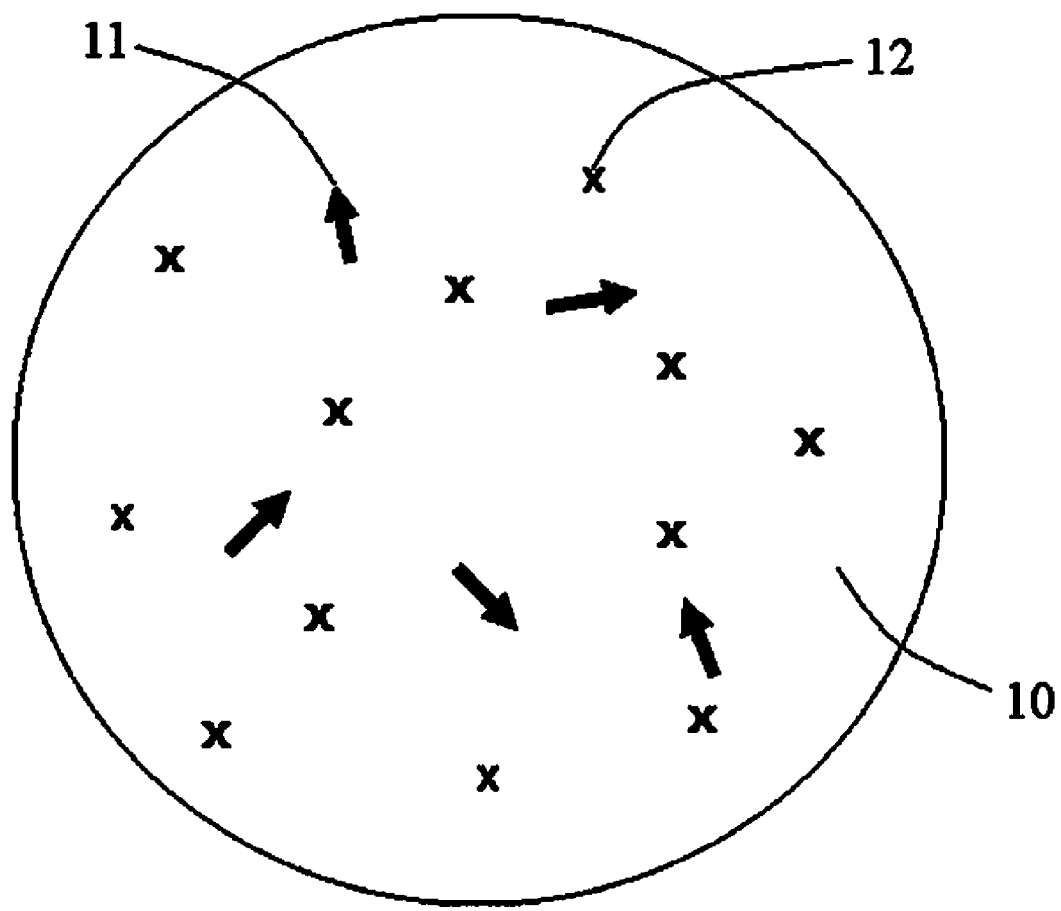
FIG. 1 is a cross-sectional view of a superconducting wire according to one embodiment of the present invention, containing both magnetic impurities and non-magnetic disorders.

Embodiments of the present invention can be generally characterized as capable of providing a method of enhancing the pinning properties and, therefore, high magnetic field properties of superconducting materials for magnet applications and power transmission. As described herein, pinning properties of superconducting materials may be enhanced using the properties of magnetic impurities to produce pinning centers in superconductors, which destroy superconductivity locally. Non-magnetic disorders, such as impurities, defects, and the like, compensate (partially or completely) for the negative effects of magnetic impurities on the high field properties due to the significant decrease of $T_c$. Thus, adding non-magnetic disorders can amplify the high field properties, i.e., vortex pinning, critical current density $J_c$, and critical magnetic field $H_c$ (in particular, the upper critical magnetic field $H_{c2}$), because the corresponding vortex size is much smaller than that of a conventional vortex. Accordingly, overall superconductivity can be maintained while vortex pinning by magnetic impurities can be retained and amplified.

A recent scanning tunneling microscopy (STM) study of magnetic impurity effect (see A. Yazdani, B. A. Jones, C. P. Luz, M. F. Crommie, and D. M. Eigler, "Probing the Local Effects of Magnetic Impurities on Superconductivity", Science Vol. 275, 1767 (1997)), can be understood to show that superconductivity is destroyed within 1 nanometer of each magnetic impurity, implying the possibility of a vortex having a very small size. In that case, the upper critical field will be much higher and the vortex will be pinned strongly, because the flux through the vortex is quantized. In addition, Kim and Overhauser in other context, i.e., in the absence of magnetic fields (see Yong-Jihn Kim and A. W. Overhauser, "Magnetic Impurities in Superconductors: A Theory with Different Predictions", Phys. Rev. B 49, 15799 (1994)) clarified that $T_c$ reduction induced by magnetic impurities can be compensated by non-magnetic disorders in absence of a magnetic field. Nevertheless, it is unknown how to generalize the above-cited Kim and Overhauser theory to solve vortex pinning due to the magnetic impurities.

Embodiments of the present invention are achieved by relying upon a better understanding of the effects of magnetic impurities on vortex pinning, which was obtained from experimental data and realizing the limitation of the above-cite Kim and Overhauser theory on this effect. First, the above STM data shows that magnetic impurities break Cooper pairs or destroy superconductivity near the magnetic impurities, leading to the quasi-particle bound state with a nanometer length scale $r_o$ (~10 Å), not the much longer coherence length scale, $\xi_0$ ($\xi_0$=~50 Å for $MgB_2$ (see C. Buzea and T. Yamashita, "Review of the Superconducting Properties of $MgB_2$", Supercond. Sci. Technol. 15, (2001) p. R115-R146)). In other words, magnetic impurities are very strong pinning centers and the corresponding the vortex size is about ~10 Å, which increases the upper critical magnetic field $H_{c2}$ significantly due to the flux quantization.

In view of the above, magnetic impurities have both a positive effect on vortex pinning, by destroying superconductivity near impurities locally, and a negative effect on vortex pinning, by reducing the global superconducting free energy and the corresponding superconducting transition temperature $T_c$. The negative effect increases when the magnetic impurity concentration is increases because the $T_c$ reduction eventually leads to the reduction of the critical current $J_c$ and the upper critical magnetic field $H_{c2}$.

Figure 6:
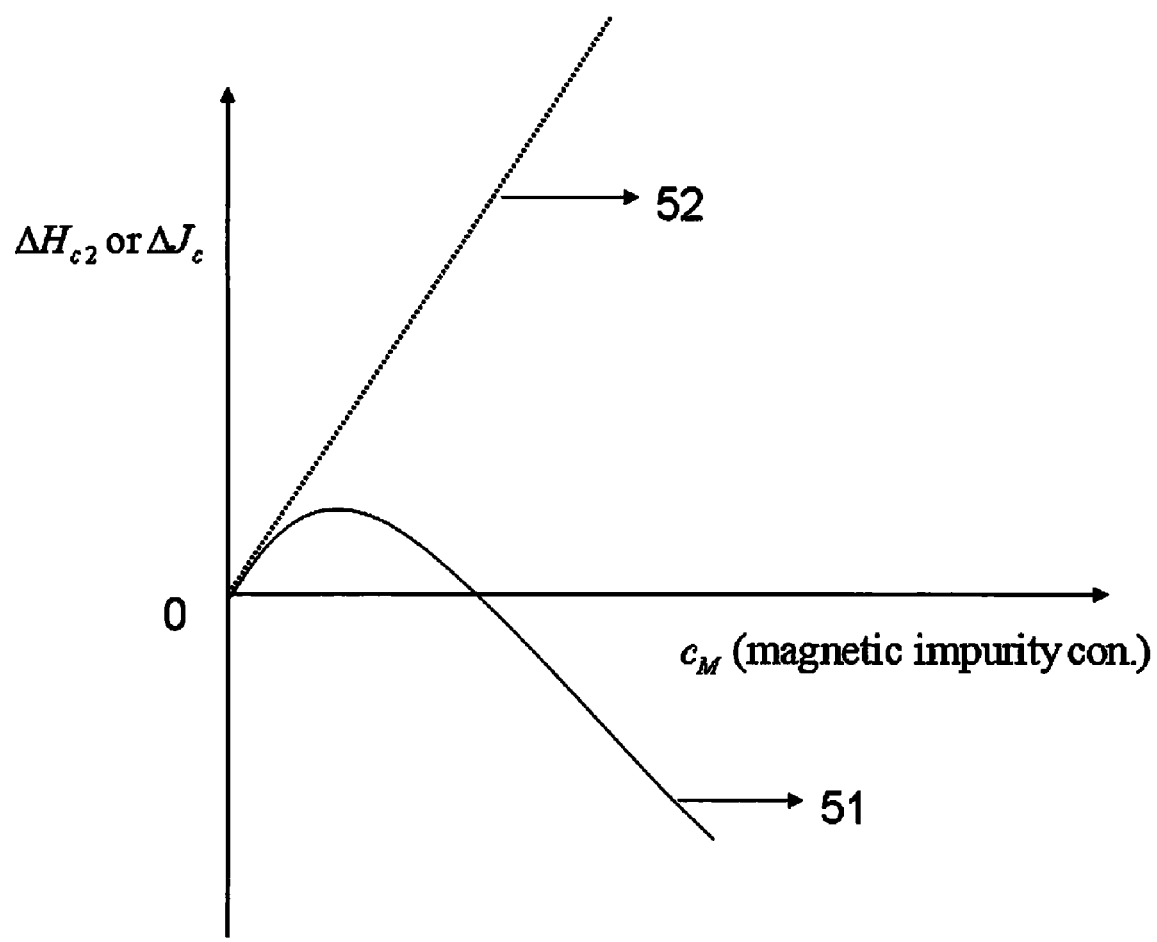
FIG. 6 is a schematic diagram of magnetic impurity concentration dependence of $J_c$ or $H_{c2}$, illustrating effects of the magnetic impurities on the vortex pinning, and enhancement of high field properties by the non-magnetic disorders according to embodiments of the present invention.

Forming non-magnetic disorders in the superconductor can suppress the negative effect of magnetic impurities (partially or completely), therefore amplifying the positive effect of magnetic impurities. For example, the previous experimental study showed that only a very small amount of magnetic impurities can enhance high field properties of superconductors and that the enhancement is gone upon further adding a small amount of magnetic impurities. This effect is shown in FIG. 6 by line 51. However, according to embodiments of the present invention, when non-magnetic disorders are added to the superconductor containing the magnetic impurities, the critical current density $J_c$ and/or the upper critical magnetic field $H_{c2}$ will be significantly enhanced, which is highly non-trivial. This effect is shown in FIG. 6 at line 52. The theory by which high field properties can be enhanced by non-magnetic disorders will be explained in greater detail with reference to FIGS. 1 and 2.

FIG. 1 illustrates a cross-sectional view of a superconductor in accordance with an embodiment of the present invention.

The superconductor 10 may be provided as a wire. The superconductor 10 may include superconducting material such as Nb—Ti alloy, $Nb_3Sn$, $MgB_2$ and the like. Magnetic impurities 11 (depicted as arrows), may be formed in the superconducting material and function as vortex pinning centers. Non-magnetic disorders 12 (depicted as "x"s), are added to compensate for the overall $T_c$ decrease (partially or completely) due to magnetic impurities 11. In one embodiment, the spin of the magnetic impurities 11 can be randomly oriented (i.e., paramagnetic), as shown in FIG. 1. In other embodiments, the spin of the magnetic impurities 11 can be oriented ferromagnetic or anti-ferromagnetic in the superconductor 10. In one embodiment, the magnetic impurities can be provided as magnetic nanoparticles, although the size of nanoparticles may be controlled to enhance the high field properties significantly.

Figure 2:
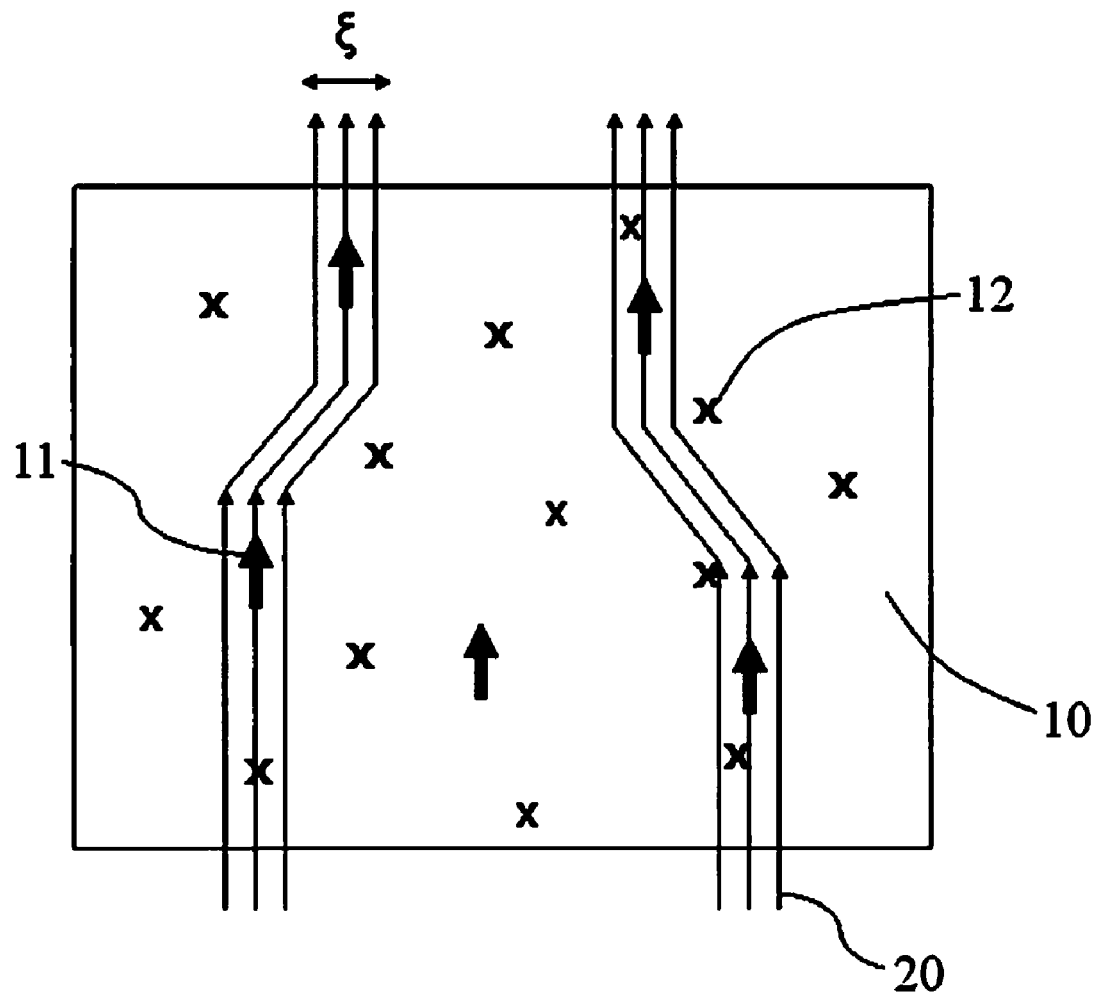
FIG. 2 is a schematic view illustrating the corresponding vortex configuration in a superconductor in FIG. 1.

FIG. 2 illustrates a schematic view of the corresponding vortex configuration in a superconductor in FIG. 1.

Referring to FIG. 2, lines 20 denote the magnetic field lines of force. The size of the vortex, $\xi$, is smaller than that of a conventional vortex. In one embodiment, the size of the vortex, $\xi$, is of the order of $r_o=\sim 10$ Å. The resulting vortex size and the upper critical magnetic field $H_{c2}$ can be roughly estimated which, to the knowledge of the inventor, has never been accomplished before. The vortex size, $\xi$, will be constrained by the size of the quasiparticle bound state, $r_o=\sim 10$ Å, and the ratio of the mean free path (due to magnetic impurities 11), $\lambda_s$, and the size of the Cooper pair (i.e., the Bardeen-Cooper-Schrieffer (BCS) coherence length), $\xi_0$. When $\lambda_s$ is almost the same as $\xi_0$, the vortex size, $\xi$, will be comparable to the size of the quasiparticle bound state, $r_o=\sim 10$ Å (more accurately, $\xi \approx 2r_o=\sim 20$ Å). However, when $\lambda_s > \xi_0$, the vortex size, $\xi$, will be bigger than $2r_o$ (i.e., comparable to $\xi_0$). Combining these two cases, the following is obtained:

$$\xi \approx 2r_o f\left(\frac{\ell_s}{\xi_0}\right). \quad \text{Eq. (1)}$$

Here, "$f$" means an appropriate function. For simplicity, "$f$" may be chosen in the following way, $$\xi \approx 2r_o\left(\frac{\ell_s}{\xi_0}\right)^a, \quad \text{Eq. (2)}$$

with a certain exponent $\alpha$. The corresponding Ginzburg-Landau coherence length, $\xi_{GL}$ is then given by $$\xi_{GL} \approx 2r_o\left(\frac{\ell_s}{\xi_0}\right)^a \left(\frac{T_c}{T_c - T}\right)^{\frac{1}{2}}. \quad \text{Eq. (3)}$$

Finally, the upper critical field, $H_{c2}$ can be found as follows (see W. Buckel and R. Kleiner, "Superconductivity" Wiley-VCH, Weinheim (2004), p. 236), $$H_{c2} = \frac{\Phi_0}{2\pi\xi_{GL}^2} = \frac{\Phi_0}{8\pi r_0^2}(\xi_0/\ell_s)^{2a}\left(1 - \frac{T}{T_c}\right). \quad \text{Eq. (4)}$$

In the presence of the non-magnetic disorders 12, such as impurities, defects, or the like, with the mean free path due to non-magnetic disorders $\lambda < \xi_0$, the Cooper pair size is reduced from $\xi_0$ to $\xi_{eff}$ $$\xi_{eff} = \sqrt{\lambda \xi_0}. \quad \text{Eq. (5)}$$

Consequently, $\xi_{eff}$ is much bigger than $2r_0=\sim 20$ Å in most superconductors. Consequently, the vortex size is still constrained by $2r_0$ and Eq. (4) is still valid. It is stressed that magnetic impurities 11 basically lead to the small size of the vortex and thereby lead to the significant increase of the upper critical field $H_{c2}$. The critical current density is also enhanced with almost the same rate, $$J_c = J_{c0}\left(\frac{\xi_0}{r_0}\right)^2\left(\frac{\xi_0}{\ell_s}\right)^{2a}, \quad \text{Eq. (6)}$$

if it is assumed that $J_c$ is proportional to $H_{c2}$ (see W. Buckel and R. Kleiner, "Superconductivity", Wiley-VCH, Weinheim (2004), p. 271). Here $J_{c0}$ is the critical current density for a pure superconductor. Accordingly, the irreversibility field, $H_{irr}$, will be enhanced significantly.

Experimentally, it has been known that small amounts of magnetic impurities can enhance high field properties of superconductors. (see Y. Kuwasawa, K. Sekizawa, N. Usui, and K. Yasukochi, "Effects of Paramagnetic Impurities on Superconducting Properties in the $La_{3-x}Gd_xAl$ System", J. Phys. Soc. Japan 27, 590 (1969); D. K. Finnemore, D. L. Johnson, J. E. Ostenson, F. H. Spedding, and B. J. Beaudry, "Superconductivity in Pure La and La—Gd", Phys. Rev. 137, A 550 (1965); and R. P. Guertin, J. E. Crow, A. R. Sweedler, and S. Foner, "Upper critical fields of superconducting Gd and Tm doped $LaSn_3$: Effects of crystalline electric fields", Sol. Sta. Commun. 13, 25 (1973)). However, such enhancement was obtained when only a small amount of magnetic impurities were provided and/or was accompanied by a significant $T_c$ decrease due to the magnetic impurities. Thus, such enhancement is not practical.

Figure 3:
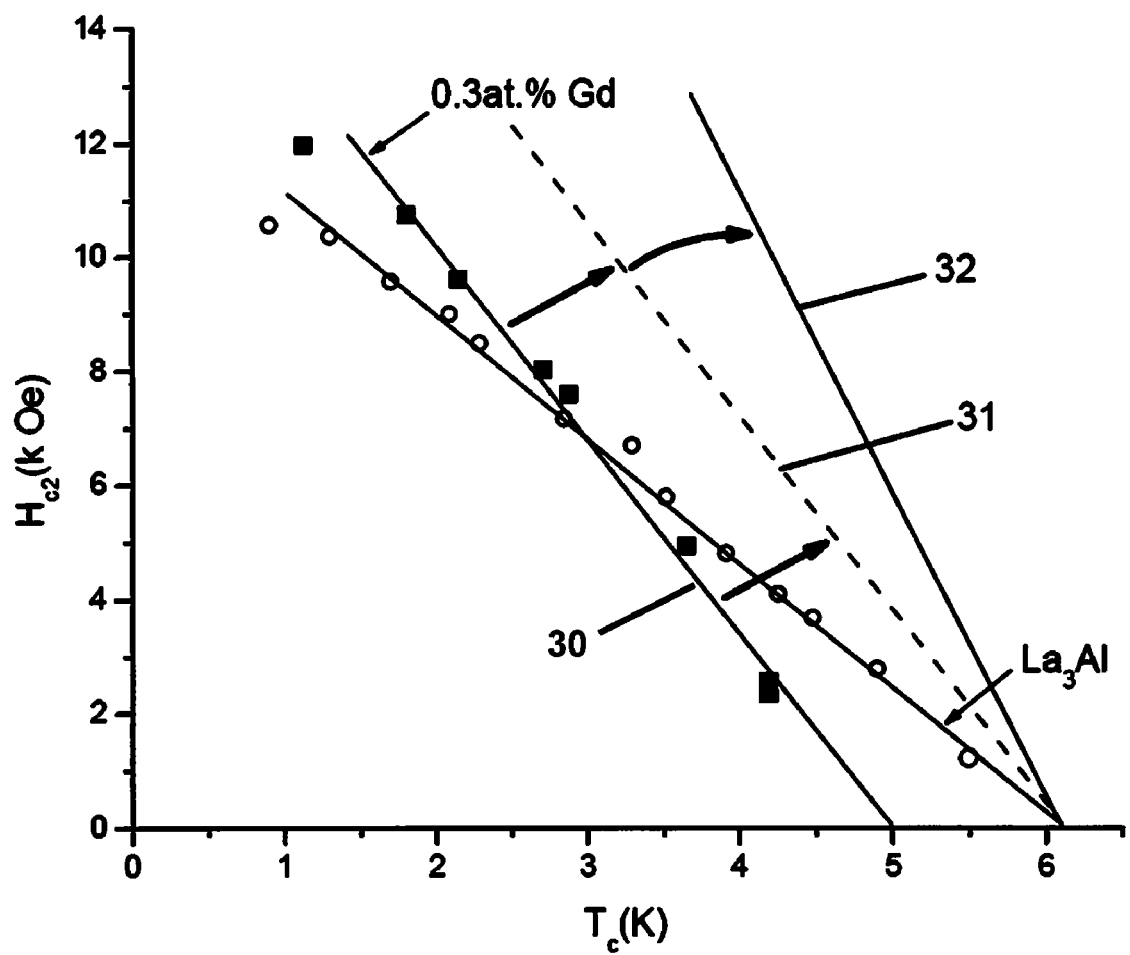
FIG. 3 shows a schematic diagram of the temperature dependence of $H_{c2}$ of $La_3Al$-based superconducting material, comparing properties a conventional example and an example according to one embodiment of the present invention.

Embodiments of the present invention provide a practical way to significantly enhance the high field properties of any superconductor, including Nb—Ti, $Nb_3Sn$, and $MgB_2$. For instance, FIG. 3 is a $T_c$-$H_{c2}$ graph illustrating how embodiments of the present invention can be applied to enhance the upper critical field, $H_{c2}$, of $La_3Al$. It is has been found that adding 0.3 at. % of Gd increases the slope of the temperature dependence of $H_{c2}$, while decreasing $T_c$ about 1K. (see Y. Kuwasawa, K. Sekizawa, N. Usui, and K. Yasukochi, "Effects of Paramagnetic Impurities on Superconducting Properties in the $La_{3-x}Gd_xAl$ System", J. Phys. Soc. Japan 27, 590 (1969)) This result is shown at solid line 30. The dashed line 31 represents the expected result when only non-magnetic disorders are added to $La_3Al$ to compensate for the $T_c$ reduction, without taking into account the slope increase. Solid line 32 represents the result upon adding magnetic impurities and non-magnetic disorders to $La_3Al$. As shown, the slope of the solid line 32 is further increased compared to the slope of dashed line 31. A theoretical prediction, Eq. (5), quantifies the enhancement of $H_{c2}$ due to both magnetic impurities and non-magnetic disorders, i.e., line 31 (in which $\lambda_s=3.3494\xi_0$, $\lambda=0.5\xi_0$, and $\alpha=1$) and line 32 (in which $\lambda_s=2.817\xi_0$, $\lambda=0.5\xi_0$, and $\alpha=1$).

Figure 4:
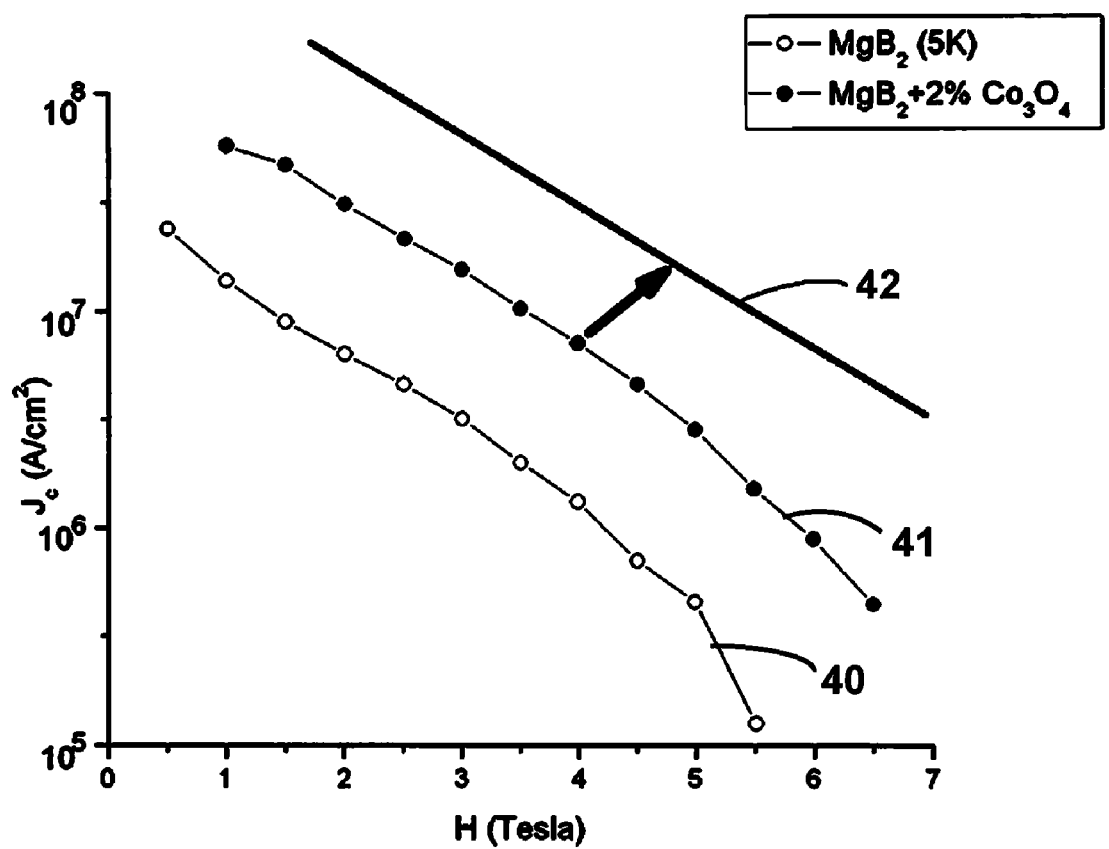
FIG. 4 shows the critical current density $J_c$ versus applied magnetic field at 5K for pure $MgB_2$ and 2% nano-$Co_3O_4$ doped $MgB_2$, comparing properties of conventional examples and an example according to one embodiment of the present invention.

To the knowledge of the inventor, there has been no experimental study for the effect of magnetic impurity on vortex pinning in $MgB_2$. However, a few studies of the effect of the magnetic nano-particles on the vortex pinning in $MgB_2$ have been conducted. Magnetic nano-particles and magnetic impurities will have almost the same effect on vortex pinning. FIG. 4 shows the critical current density $J_c$ of $MgB_2$ at line 40, the critical current density $J_c$ of $MgB_2$ doped with 2% $Co_3O_4$ nano-particles at line 41, and the critical current density $J_c$ of $MgB_2$ doped with 2% $Co_3O_4$ nano-particles as well as non-magnetic disorders in accordance with embodiments of the present invention at line 42.

Referring to FIG. 4, enhancement of the critical current density $J_c$ of $MgB_2$ by adding 2% $Co_3O_4$ nano-particles has been reported by Awanda et al. (cond-mat/0601359). Awanda et al. found that $J_c$ starts to decrease for 4% and 6% $Co_3O_4$ nano-particles, presumably due to the $T_e$ decrease and the concomitant reduction of $J_c$. Therefore, 2% doping shows the maximum increase in critical current density $J_c$ that has been conventionally achieved. According to embodiments of the present invention, however, the critical current density $J_c$ of $MgB_2$+2% $Co_3O_4$ can be further enhanced by adding non-magnetic disorders. If enough non-magnetic disorders are added, with the mean free path, $\lambda \sim 30$ Å $< \xi_0 \sim 50$ Å, to reduce the Cooper pair size of $MgB_2$, the vortex pinning can be amplified while compensating for $T_c$ reduction, leading to the further amplification of $J_c$, as shown at line 42.

It has been found that samples with 0.13 wt. % $Fe_2O_3$ nano-particles show considerable enhancement of the magnetic hysteresis, whereas 0.26 wt. % added samples show moderate increase of the hysteresis. (see Prozorov et al. Appl. Phys. Lett. 83 (2003) p. 2019) Consequently, the enhancement of flux pinning due to the magnetic nano-particle doping is only limited to the very low doping level, which is not that useful. On the other hand, a decrease of critical currents due to the FeB nano-particles has been found with the (higher) doping level above 1 wt. %. (see Dou et al., Supercond. Sci. Technol. 18 (2005) p. 710) It seems that Dou et al. might have found the enhancement for the lower doping level around 0.2 wt. %. However, according to embodiments of the present invention, adding non-magnetic disorders into a superconducting material can compensate for the negative effect (i.e., decrease of $T_c$ or $T_e$) of magnetic impurities and at the same time amplify the positive effect (i.e., increase of $H_{c2}$ and $J_c$). Thus, a superconducting transition temperature of superconducting material containing magnetic impurities and non-magnetic disorders can be greater than that of superconducting material containing only the magnetic impurities and not the non-magnetic disorders.

According to embodiments of the present invention, any available technique can be used to introduce magnetic impurities and non-magnetic disorders into the superconductor. For example, techniques such as diffusion, arc-melting, solid-state reactions, quenching-condensation, pulsed laser deposition (PLD), sputtering, molecular beam epitaxy (MBE), mechanical alloying, irradiation and implantation, chemical vapor deposition (CVD), powder-in-tube (PIT) technique, and the like may be used to introduce magnetic impurities and non-magnetic disorders into the superconductor. The solubility of magnetic impurities within the superconducting material may be an issue. Therefore, magnetic impurities with the optimum solubility should be chosen depending on the superconductor material and the technique. If magnetic impurities are added above the solubility limit, some magnetic impurities can form precipitates. In this case, the precipitates still can contribute to increase the critical current density $J_c$, but the upper critical fields $H_{c2}$ will not increase much because the precipitates are basically independent of the superconducting matrix. Adding magnetic nanoparticles (see T. H. Alden and J. Livingston, "Ferromagnetic Particles in a Type-II superconductor", J. Appl. Phys. 37, 3551 (1966); C. C. Koch and G. R. Love, "Superconductivity in Niobium containing ferromagnetic Gadolinium or paramagnetic Yttrium dispersions", J. Appl. Phys. 40, 3582 (1969); and A. Snezhko, T. Prozorov, and R. Prozorov, "Magnetic nanoparticles as efficient bulk pinning centers in type-II superconductors", Phys. Rev. B 71, 024527 (2005)), artificial magnetic pins (see N. D. Rizzo, J. Q. Wang, D. E. Prober, L. R. Motowidlo, and B. A. Zeitlin, "Ferromagnetic artificial pinning centers in superconducting $Nb_{0.36}Ti_{0.64}$ wires", Appl. Phys. Lett. 69, 2285 (1996)), and magnetic dots (see G. Teniers, M. Lange, V. V. Moshchalkov, "Vortex dynamics in superconductors with a lattice of magnetic dots", Physica C 369, 268 (2002)), can lead to similar enhancement of critical currents, like the magnetic impurity addition. However, these techniques may require fine tuning of nanoparticle size, which may not be adequate for the mass production. Nevertheless, the negative effect of the magnetic nanoparticles can also be compensated by adding non-magnetic disorders as discussed herein and the positive effect can thus be amplified by the non-magnetic disorders. Accordingly, methods disclosed in embodiments of the present invention are advantageous because they can significantly enhance the high field properties of superconductors, i.e., enhancement of both $H_{c2}$ and $J_c$ because it is intrinsic and powerful due to the magnetic impurity induced strong pinning of vortices.

According to some embodiments of the present invention, magnetic impurities can, for example, include at least one selected from the group consisting of an ion with partially-filled d-electrons (i.e., a transition metal) such as Mn, Fe, Ni, Cr, Co, Y, Zr, Nb, Mo, Tc, Ru, Rh and the like; an ion with partially-filled f-electrons (i.e., a rare earth element) such as Ce, Pr, Nd, Pm, Sm, Eu, Gd, Tb, Dy, Ho, Er, Tm, U and the like; and a magnetic particle (e.g., a magnetic precipitate).

According to some embodiments of the present invention, non-magnetic disorders can, for example, include at least one selected from the group consisting of a non-magnetic ion with an s-electron and/or a p-electron such as Zn, Al, Ti, C, B, Li, and the like. According to some embodiments of the present invention, non-magnetic disorders can, for example, include any form of crystalline defect, such as at least one selected from the group consisting of a vacancy defect, an interstitial defect, a dislocation, radiation damage, and the like. According to some embodiments of the present invention, non-magnetic disorders can, for example, include at least one selected from the group consisting of a non-magnetic particle (e.g., a non-magnetic precipitate), a second-phase inclusion, a nano-sized particle, a segregate in a grain boundary of the superconducting material, and the like. It will also be appreciated that the non-magnetic disorders can include a combination of the above examples. In one embodiment, the non-magnetic disorders can be formed in the superconductor material by varying the processing conditions during formation of the superconductor material. In another embodiment, the non-magnetic disorders can be formed after the superconductor material has been formed. All these metallurgical problems should be taken into account for the optimum combination of magnetic impurities and non-magnetic disorders. For instance, combinations of Mn, Co, Fe, Ni, etc., as magnetic impurities and C, Zn, Al, etc., as non-magnetic disorders may be used in accordance with embodiments of the present invention.

$MgB_2$ has a rather small Cooper pair size in the range of 37-128Å (see C. Buzea and T. Yamashita, "Review of the Superconducting Properties of $MgB_2$", Supercond. Sci. Technol. 15, (2001) p. R115-R146). Although $MgB_2$ does not have a weak link problem between the grain boundaries, the abundance of precipitates, nano-particles, or second phase inclusions, comparable to the size of the Cooper pair, in the grain boundaries may still lead to reduced critical currents. Consequently, it is desirable to control the size of precipitates, nano-particles, and second phase inclusions of the doping elements to be less than the size of the Cooper pair, which can then enhance the critical currents.

Figure 5:
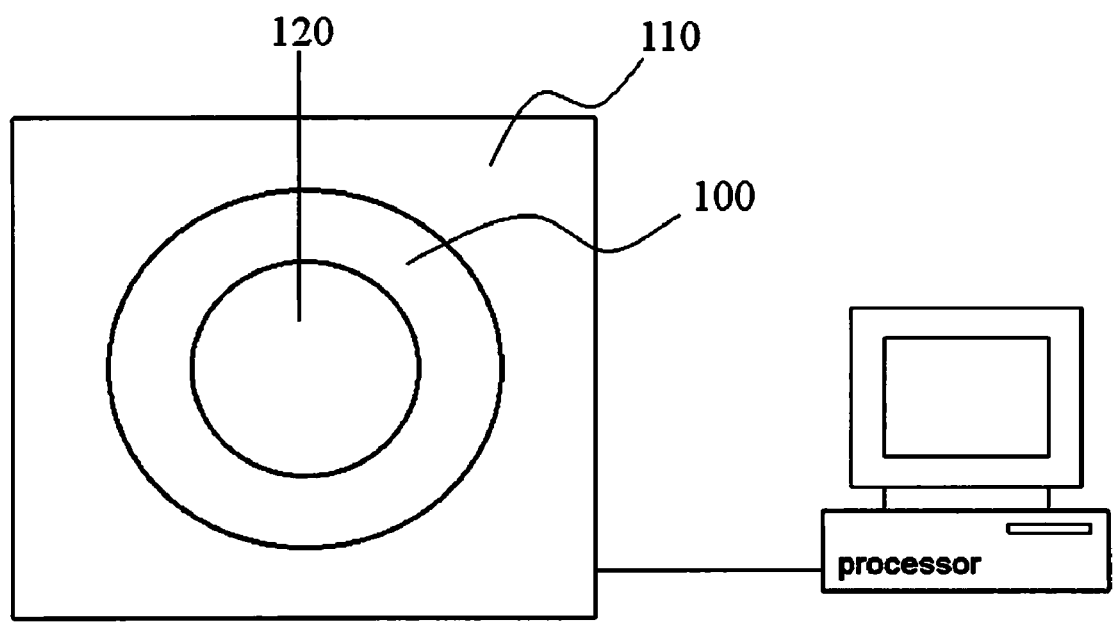
FIG. 5 shows a schematic diagram of an MRI or NMR apparatus with a $MgB_2$ magnet manufactured in accordance with embodiments of the present invention.

FIG. 5 shows a schematic diagram of an MRI or NMR apparatus with a MgB$_2$ magnet manufactured in accordance with embodiments of the present invention.

Referring to FIG. 5, an MRI or NMR apparatus may include a MgB$_2$ magnet 100 containing both magnetic impurities and non-magnetic disorders. The MgB$_2$ magnet 100 may be capable of producing a magnetic field of 1~3 Tesla at 20K. Using the cryocooler 110, the MRI or NMR can be configured to generate image for a patient lying in the scanner bore 120.

The optimum amount of magnetic impurities and non-magnetic disorders can be determined from the optimum increase of the critical current density $J_c$ and the upper critical magnetic field $H_{c2}$ of the superconducting material, such as MgB$_2$. In one embodiment, the concentration of magnetic impurities may range from 0.1% to 10% of the superconducting material, which corresponds to a 20~30% decrease in $T_c$, depending on the magnetic impurity and the superconducting material.

In one embodiment, the concentration of non-magnetic disorders within the superconductor material can be estimated from the resulting mean free path $\lambda$ which should be comparable to, or smaller than, the BCS coherence length $\xi_0$ of the superconducting material such that:

$$\tfrac{1}{3} \leq \xi_0/\lambda \leq 3 \qquad \text{Eq. (7)}$$

In one embodiment, the concentration of non-magnetic disorders may range from 1% to 20% of the superconducting material. In another embodiment, the concentration of non-magnetic disorders in the superconducting material may be selected such that any non-magnetic disorder leads to the mean free path $\lambda$ and satisfies Eq. (7).

As will be appreciated, embodiments of the present invention may be practiced in many ways. What follows in the paragraphs below is a non-limiting discussion of some embodiments of the present invention.

In one embodiment, a superconductor with a high magnetic field property below a superconducting transition temperature includes: a superconducting material having a superconductivity; magnetic impurities formed in the superconducting material; and non-magnetic disorders formed in the superconducting material. The non-magnetic disorders may increase an upper critical magnetic field or a critical current density of the superconductor to a value greater than that in case of only forming the magnetic impurities in the superconducting material.

In another embodiment, a method for manufacturing a superconductor with a high magnetic field property below a superconducting transition temperature includes steps of: preparing a superconducting material having a superconductivity; forming magnetic impurities in the superconducting material; and forming non-magnetic disorders in the superconducting material. The non-magnetic disorders may increase an upper critical magnetic field or a critical current density of the superconductor to a value greater than that in case of only forming the magnetic impurities in the superconducting material. The magnetic impurities and the non-magnetic disorders can be formed in a single process during the preparation of the superconducting material, or after formation of the superconducting material.

As exemplarily described herein, a superconductor contains both magnetic impurities and non-magnetic disorders (e.g., impurities, defects, and the like), which enable high field properties of the superconductor to be significantly enhanced. If magnetic impurities are added over the solubility limit, they can form extra precipitates or nanoparticles which can still contribute to the enhancement of high field properties. Embodiments of the present invention can be easily adapted to powder-in-tube (PIT) MgB$_2$ wires and tapes. The resulting MgB$_2$ magnet is expected to produce 1-3 T at 20K, which can replace the current Nb—Ti magnet for MRI and related NMR apparatus. The magnetic impurity may be chosen to have an optimum solubility within the superconducting material.

While embodiments of the present invention have been exemplarily shown and described above, it will be understood by those skilled in the art that various changes in form and details may be made therein without departing from the spirit and scope of the invention as defined by the appended claims.

What is claimed is:

1. A superconductor, comprising:
   a superconducting material containing magnetic impurities; and
   non-magnetic disorders formed in the superconducting material.

2. The superconductor of claim 1, wherein the superconducting material includes at least one selected from the group consisting of: Nb$_3$Sn, and MgB$_2$.

3. The superconductor of claim 1, wherein the magnetic impurities function as to vortex pinning centers.

4. The superconductor of claim 1, wherein the superconductor includes Nb—Ti alloy comprising: Nb as the superconducting material; Ti as the non-magnetic disorders; and the magnetic impurities.

5. The superconductor of claim 1, wherein the magnetic impurities include at least one selected from the group consisting of: a magnetic ion with partially-filled d-electrons, a magnetic ion with partially-filled f-electrons, and a magnetic particle.

6. The superconductor of claim 1, wherein the magnetic impurities include at least one material selected from the group consisting of: Mn, Fe, Ni, Cr, Co, Y, Zr, Nb, Mo, Tc, Ru, and Rh.

7. The superconductor of claim 1, wherein the magnetic impurities include at least one material selected from the group consisting of: Ce, Pr, Nd, Pm, Sm, Eu, Gd, Tb, Dy, Ho, Er, Tm, and U.

8. The superconductor of claim 1, wherein a concentration of magnetic impurities within the superconducting material ranges from 0.1 at. % to 20 at. %.

9. The superconductor of claim 1, wherein a superconducting transition temperature of the superconducting material comprising the magnetic impurities and the non-magnetic disorders is greater than that of the superconducting material comprising the magnetic impurities and not comprising the non-magnetic disorders.

10. The superconductor of claim 1, wherein the non-magnetic disorders include at least one selected from the group consisting of a crystalline defect, a non-magnetic ion with an s-electron or p-electron, and a non-magnetic particle.

11. The superconductor of claim 10, wherein the non-magnetic disorders include at least one crystalline defect selected from the group consisting of a vacancy defect, an interstitial defect, a dislocation, and radiation damage.

12. The superconductor of claim 10, wherein the non-magnetic disorders include at least one non-magnetic particle selected from the group consisting of: a precipitate, a second-phase transition, nano-sized particles, and a segregate in a grain boundary of the superconducting material.

13. The superconductor of claim 1, wherein the non-magnetic disorders include at least one material selected from the group consisting of Zn, Al, Ti, C, B and Li.

14. The superconductor of claim 1, wherein a concentration of the non-magnetic disorders within the superconducting material is selected such that $\xi_0/\lambda$ is in a range of $1/3 \leq \xi_0/\lambda \leq 3$, where $\xi_0$ is a BCS coherence length of the superconducting material and $\lambda$ is a mean free path within the superconducting material comprising the non-magnetic disorders.

15. The superconductor of claim 1, wherein a concentration of the non-magnetic disorders within the superconducting material ranges from 1 at. % to 40 at. %.

* * * * *